United States Patent
Pickerd et al.

(10) Patent No.: US 10,274,520 B2
(45) Date of Patent: Apr. 30, 2019

(54) OFFSET STACKED COMPRESSOR AMPLIFIERS IN A DISCRETE DIGITIZER SYSTEM FOR NOISE REDUCTION AND INCREASED RESOLUTION

(71) Applicant: Tektronix, Inc., Beaverton, OR (US)

(72) Inventors: John J. Pickerd, Hillsboro, OR (US); Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 410 days.

(21) Appl. No.: 14/870,357

(22) Filed: Sep. 30, 2015

(65) Prior Publication Data
US 2017/0089954 A1    Mar. 30, 2017

(51) Int. Cl.
*G01R 13/02* (2006.01)
*H03M 1/18* (2006.01)

(52) U.S. Cl.
CPC ....... *G01R 13/0218* (2013.01); *G01R 13/029* (2013.01); *G01R 13/0272* (2013.01); *H03M 1/188* (2013.01)

(58) Field of Classification Search
CPC ............ G01R 13/0218; G01R 13/0272; G01R 13/029; H03M 1/08; H03M 1/121
USPC .......................................................... 702/67
See application file for complete search history.

(56) References Cited

U.S. PATENT DOCUMENTS

| 6,683,552 | B2 | 1/2004 | Noll et al. |
| 7,411,537 | B2 | 8/2008 | Hjelmstad et al. |
| 8,928,514 | B1 | 1/2015 | Pickerd |
| 2013/0237170 | A1 | 9/2013 | Pickerd |
| 2013/0268212 | A1* | 10/2013 | Makarov ............... H01J 49/025 702/32 |
| 2014/0225591 | A1 | 8/2014 | Knierim |
| 2014/0285251 | A1 | 9/2014 | Carlson |

OTHER PUBLICATIONS

European Patent Office, Extended European Search Report and Opinion for European Patent Application No. 16191308.2, dated Feb. 23, 2017, 7 pages, Munich, Germany.
Brandy Sausse, "A Parallel Architecture for Analog-to-Digital Conversion with Improved Dynamic Range," University of New Orleans Theses and Dissertations, Paper 502, 2006.
Robert Fifield, "Streching the dynamic range of a/d converters," New Electronics, http://electronicsroom.org/stretching-the-dynamic-range-of-ad-converters/ (downloaded on Oct. 14, 2015), 2012.

(Continued)

*Primary Examiner* — Huan Hoang
(74) *Attorney, Agent, or Firm* — Miller Nash Graham & Dunn; Kevin D. Dothager; Andrew J. Harrington

(57) ABSTRACT

A test and measurement instrument, including a splitter configured to split an input signal into two split input signals and output each split input signal onto a separate path and a combiner configured to receive and combine an output of each path to reconstruct the input signal. Each path includes an amplifier configured to receive the split input signal and to compress the split input signal with a sigmoid function, a digitizer configured to digitize an output of the amplifier; and at least one processor configured to apply an inverse sigmoid function on the output of the digitizer.

14 Claims, 16 Drawing Sheets

(56) References Cited

OTHER PUBLICATIONS

Gregers-Hansen et al, "A stacked A-to-D converter for increased radar signal processor dynamic range," Radar Conference, Proceedings of the 2001 IEEE, pp. 169-174, 2001.

Ding et al, "Tanh cascade cell amplifier—an arbitrary transfer characteristics amplifier," Electonics Letters, vol. 46, No. 22, pp. 1495-1497, 2010.

\* cited by examiner

OFFSET STACKED COMPRESSOR AMPLIFIERS IN A DISCRETE DIGITIZER SYSTEM FOR NOISE REDUCTION AND INCREASED RESOLUTION

TECHNICAL FIELD

This disclosure relates to a discrete digitizer system containing two or more digitizers and two or more compressor amplifiers that are vertically stacked with the same scale but different offsets.

BACKGROUND

Oscilloscopes have typically used 8-bit analog-to-digital converters (ADC) as an optimal tradeoff between system bandwidth and noise. ADCs with more bits typically operate at lower sampling rates. An 8-bit digitizer offers 256 levels of resolution for a non-averaged ideal dynamic range of approximately 48 dB; however, there are numerous applications that require more than 48 dB of dynamic range.

There are a few specialized oscilloscopes that offer 12 or 16 bits of resolution at low sample rate and bandwidth to cover some applications that require more than 48 dB of dynamic range. Also, sampling oscilloscopes have higher bits of resolution but require equivalent time sampling as a tradeoff.

Oscilloscopes also insert noise into signals. For applications such as pulse amplitude modulation (PAM-4), where there are four signal levels and three eye openings on the vertical scales, the noise produced from the oscilloscope's digitizers can have major adverse effects on the resulting measurement.

Average mode and high resolution acquisition modes have been incorporated into oscilloscopes to provide more bits of vertical resolution and reduce noise. However, this also reduces both signal noise and oscilloscope noise if they are random with respect to the trigger position. The ideal would be to only reduce the oscilloscope noise. In addition, averaging does not lend itself to the major application of acquiring long records of random patterns and building eye diagrams and performing jitter measurements, which is one of the primary uses of an oscilloscope. The average mode requires multiple triggered acquisitions and a repetitive signal. The high resolution mode can be performed on a single acquisition but such a mode requires significant reduction of the sampling rate and non-aliased bandwidth.

Embodiments of the invention address these and other limitations in the prior art.

SUMMARY

Some embodiments of the disclosed technology are directed to a test and measurement instrument, including a splitter configured to split an input signal into two split input signals and output each split input signal onto a separate path and a combiner configured to receive and combine an output of each path to reconstruct the input signal. Each path includes an amplifier configured to receive the split input signal and to compress the split input signal with a sigmoid function, a digitizer configured to digitize an output of the amplifier; and at least one processor configured to apply an inverse sigmoid function on the output of the digitizer.

Other embodiments of the disclosed technology are directed to a method for reconstructing an input signal in a test and measurement instrument, the method including splitting an input signal into two split input signals and outputting each split input signal onto a separate path; compressing each split input signal with a sigmoid function on each path to produce a modified split input signal; digitizing the modified split input signal on each path; applying an inverse sigmoid function to the modified split input signal on each path to produce an output signal; and reconstructing the input signal by combining the output signal in each path.

DETAILED DESCRIPTION

Figure 1:
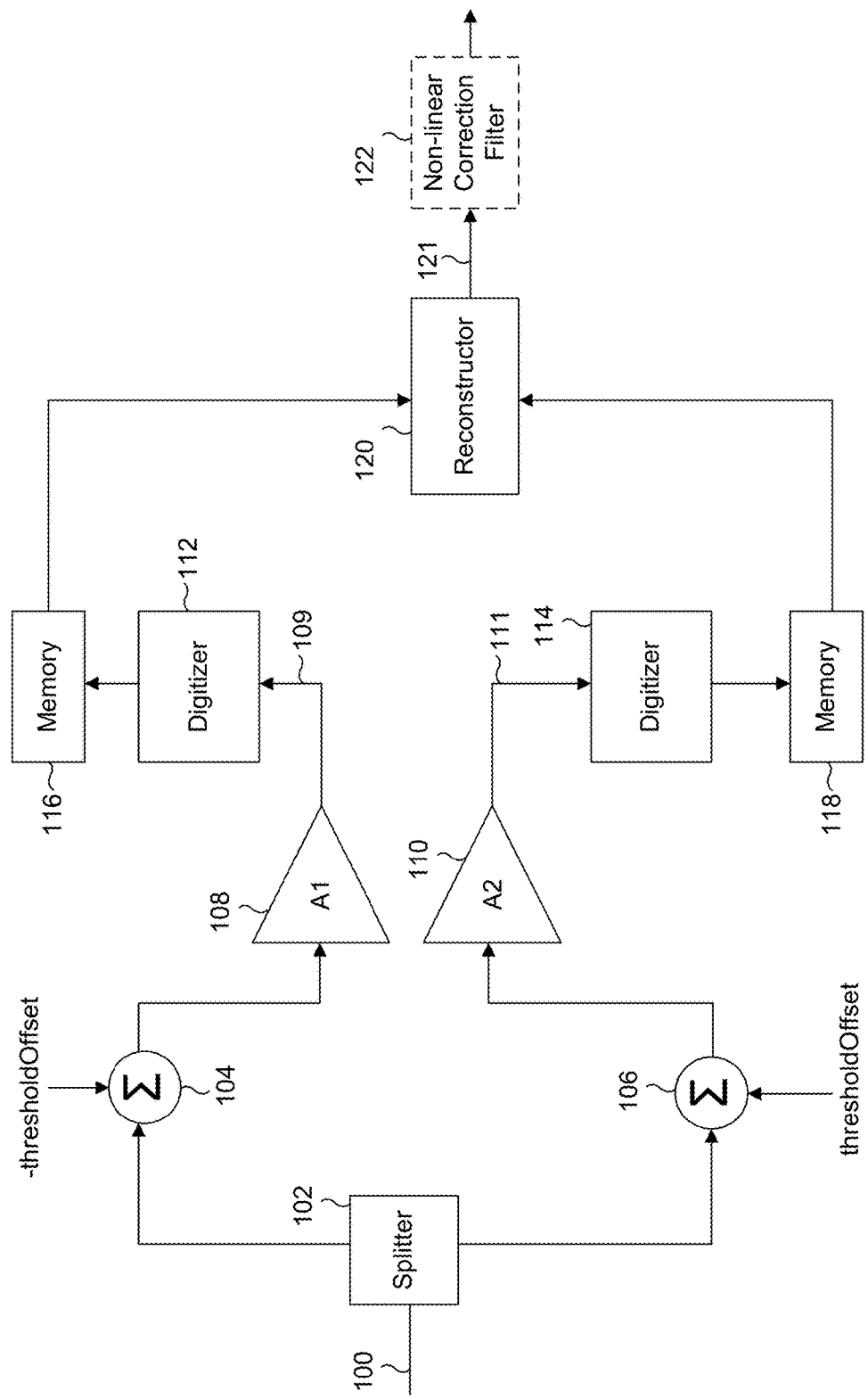
FIG. 1 illustrates a system block diagram according to some embodiments of the disclosed technology.

In the drawings, which are not necessarily to scale, like or corresponding elements of the disclosed systems and methods are denoted by the same reference numerals.

The disclosed technology relates to a discrete digitizer system containing two or more digitizers and two or more compressor amplifiers that are vertically stacked with the same scale but different offsets, as illustrated in FIG. 1. The purpose of the stacked amplifiers with different vertical offsets is to translate a vertical range of the input signal into the input range of the two or more digitizers. The amplifiers have a sigmoid, or logistical, or hyperbolic tangent (tanh) function shape to compress the high level signals to prevent the hard clipping saturation. This prevents the full input range of the amplifier from causing clipping at any point in the amplifier. This also avoids the problem of distortion due to long recovery times.

As will be discussed in more detail below, the amplifiers of the disclosed technology have a tanh transfer function of Vout/Vin, and the disclosed technology includes an inverse tanh function for correction of the reconstructed waveform. This allows amplifiers and digitizers to be stacked vertically to reduce noise by 6 dB and increase to 9-bits of resolution without hard clipping the amplifiers. A four-way system would reduce the noise by ideally 12 dB and increase the vertical resolution to ideally 10-bits.

Averaging two channels, as discussed above, cannot provide the same level of noise reduction and resolution increase. An average of two channels only provides 3 dB noise reduction and 8.5 bits of ideal vertical resolution. An average of four channels only provides 6 dB of noise reduction and 9 bits of ideal vertical resolution.

FIG. 1 illustrates a high level system block diagram showing the various components of the disclosed technology according to some embodiments. As illustrated in FIG. 1, the input signal 100 is split via a splitter 102, such as a power divider, into two paths, with each split signal containing a function of DC offset and scale, as discussed in more detail below. The splitter 102 may be external or internal to the oscilloscope. Although two paths are shown, the signal may be split into more than two paths, with each path being similar to the two paths shown in FIG. 1. That is, the splitter 102 may split the input signal into three or four split signals, with each signal going to a different path.

Figure 4:
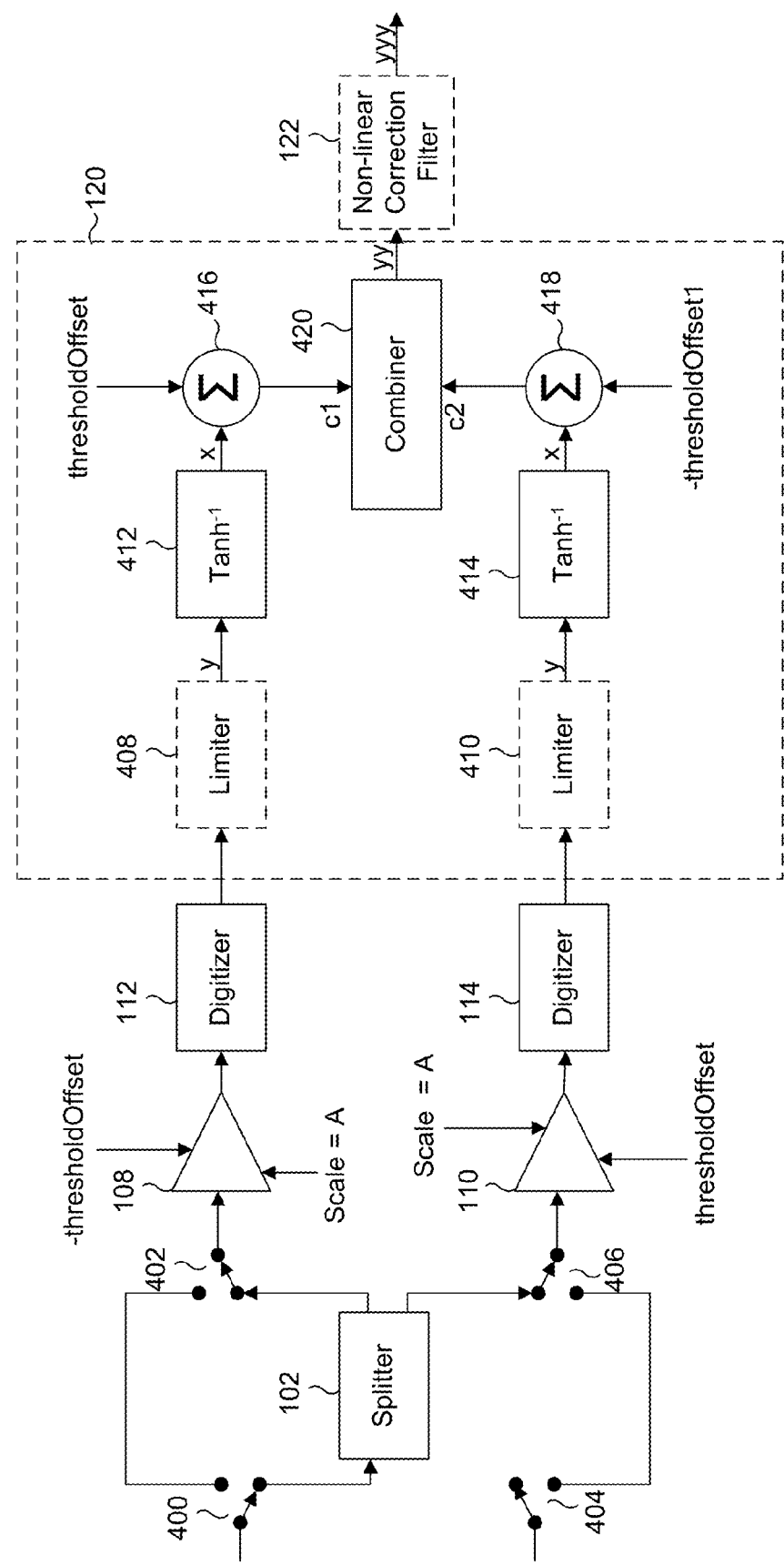
FIG. 4 illustrates a system block diagram according to some embodiments of the disclosed technology.

Each path includes a different offset value that is added to the signal through summers 104 and 106. The offsets in each summer 104 and 106 are preferably opposite polarity of each other. The offset signals are then sent to amplifiers 108 and 110. The summers 104 and 106 may be part of the amplifiers 108 and 110, as shown in FIG. 4. Assuming the scaling of the input signal is such to maximize half of the signal into the −1.0 to 1.0 range of the digitizers 112 and 114, the amplifiers 108 and 110 are designed so no transistors ever enter the saturation state as the input signal increases to where the output voltage approaches the clipping level. This is to avoid long recovery times from transistor saturation due to clipping. Thus, the amplifier compresses the signal as it approaches the positive and negative clipping levels.

Thus, the half cycle of the signal that would clip in a normal amplifier is simply compressed without clipping in the amplifiers 108 and 110. The offset of one path is set to approximately 1 and the offset of the other path is set to approximately −1. This allows one amplifier and digitizer to process the upper half of the vertical dynamic range and the other amplifier and digitizer will process the lower half of the vertical range. Further, the offset may be set to +/−0.8 or +/−0.7 so the two amplifiers 108 and 110 have an overlap region.

Amplifiers 108 and 110 both have identical transfer functions where Vout=tanh(Vin). However, other similar shapes for the transfer functions may be used as well, as discussed above. Any sigmoid shape may be used.

Once the signals have been compressed through amplifiers 108 and 110, the amplifiers output signals 109 and 111, respectively, and the signals 109 and 111 are digitized by digitizers 112 and 114. Each digitizer is at least an 8 bit digitizer. For example, the digitizers 112 and 114 may be standard 8 bit digitizers built with eight interleaved analog-to-digital converters. The digitizers 112 and 114 contain the sample and hold function along with other required logic and control circuitry.

The output from the digitizers 112 and 114 are each stored in a memory 116 and 118, respectively. The signals are then sent to a reconstructor 120 to be reconstructed, as discussed in more detail below. The reconstructor includes an inverse tanh correction filter 122, as shown in FIG. 4, and outputs a reconstructed signal 121. To obtain a maximum high bandwidth of the signal, it is assumed that the tanh function of the amplifiers 108 and 110 may have some distortion or change in shape as a function of frequency, temperature, or humidity. A non-linear correction filter 122 may be used to correct for distortion in the amplifiers 108 and 110. That is, the non-linear correction filter 122 may receive the reconstructed signal 121 and further filter the signal to provide a more accurate reconstruction of the input signal 100. This distortion may be based on Volterra type models, or on other less complex models.

Figure 2:
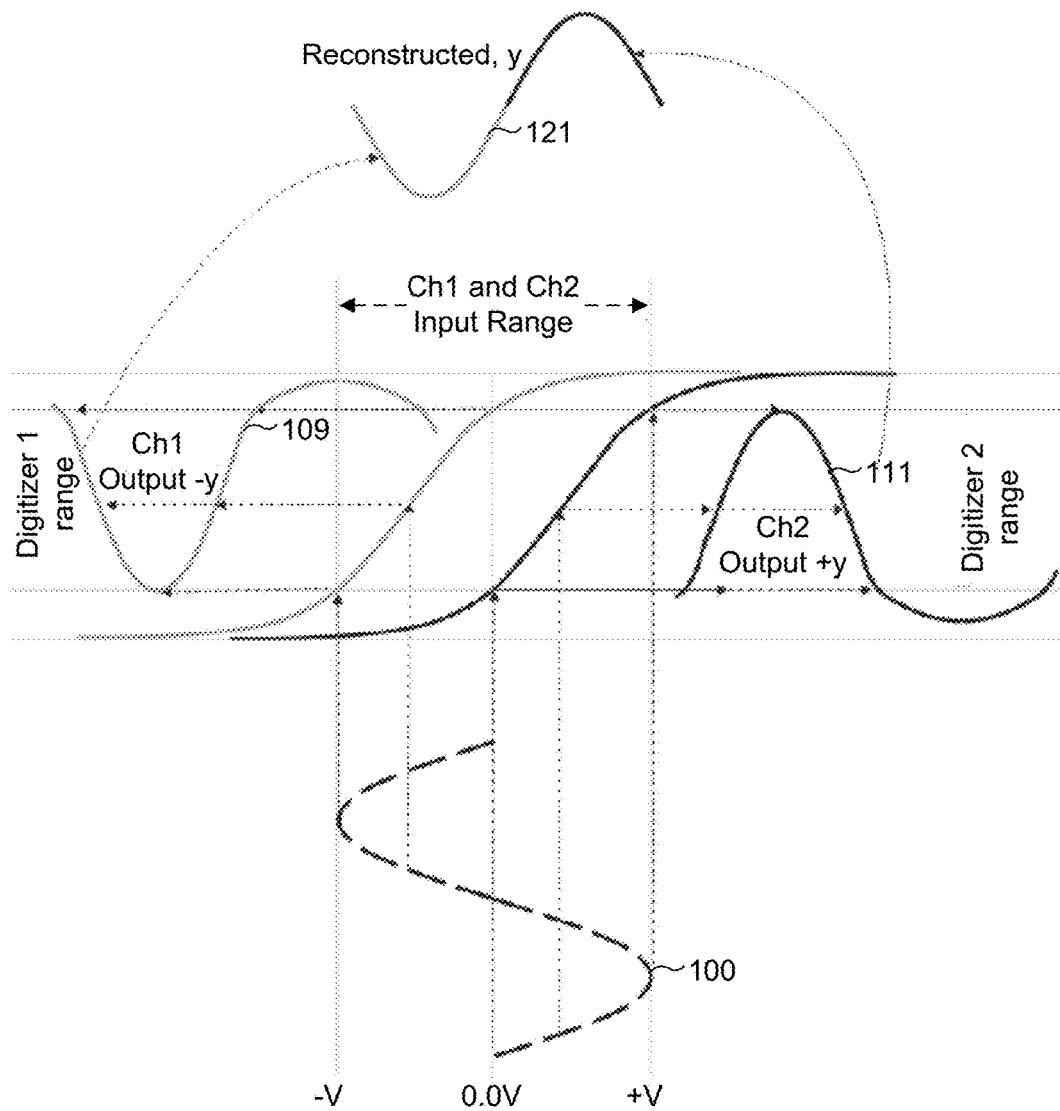
FIG. 2 illustrates the input voltage to output voltage mapping into the digitizer range according to the disclosed technology.

FIG. 2 illustrates how the input signal 100 has its negative half cycle compressed by a large amount and the positive half cycle is not compressed by such large amounts to allow the positive half cycle to pass through one of the amplifiers 108 and 110. The input signal 100 is distorted and the peak and crossover parts are compressed by small amounts and the middle range is expanded. Likewise, the other amplifier will compress the positive half cycle and pass the negative half cycle. This allows each of the waveforms to fit within the full range of each of the digitizers 112 and 114.

Thus, if the tanh functions of the amplifiers 108 and 110 were linear, the digitizer noise would generally be cut in half when the signal is reconstructed. However, the tanh function is non-linear and the noise will be reduced more than 6 dB in the middle ranges of the half cycle due to expansion prior to sampling and compressing after digitizing from the tanh function. On the other hand, noise would be reduced less on the peaks and middle crossover range because of the opposite: compression and then expansion from the tanh function.

The amplifiers 108 and 110 may include the summers 104 and 106 to add the offset, rather than being separate components, as shown in FIG. 1. The offset function would be setup to offsets of 1.0 on one amplifier and −1.0 on the other amplifier if no overlap of the two channels is used. However, it is preferable that the two channels do have some overlap to facilitate clipping of the digitizer output signals to ensure the data range is within the range of the tanh function.

Preferably, an offset of approximately 0.8 to −0.8 is used for the amplifiers to ensure that the overlap range between the two channels is larger than the noise of the digitizers 112 and 114. This overlap is defined as:

thresholdOffset:=0.8

This provides two benefits. The first is that the clipping function that is used to limit the digitizer output signals during reconstruction will ensure that the output data is always within the range of the tanh function. Otherwise, large noise spikes can occur during reconstruction. Thus, these spikes are prevented if the amplifiers 108 and 110 drift. This gives margin for the tanh function to fit into a range slightly less than the digitizer range.

The second benefit is that data from two channels in the overlap area may be averaged during reconstruction to further reduce the noise in this region. This then slightly offsets the fact that the tanh function compressed data in the overlap area and reconstruction would expand the noise slightly to where the 6 dB ideal would not be attained. Thus, the average of the two channels in the overlap range helps counteract the noise increase from the tanh function in that range.

There are multiple types of functions such as sigmoid, logistic, and tanh which have similar S-shaped transfer function curves. Any of these functions may be used for this disclosed technology. However, for the below example, a tanh function is described. The tanh function may be defined as:

C=2.221

$$\tanh(x) = \frac{e^{C \cdot x} - 1}{e^{C \cdot x} + 1} \quad (1)$$

A tanh function would ordinarily have a C equation equal to 2.0. The value C is a constant used to adjust the shape of the tanh function to obtain an optimal tradeoff between the compressed part of the range and the more linear part of the range. However, this is preferably modified to be 2.221 to make the curve shape more optimal for use in this system, where x is the input signal voltage, y is the voltage that will be digitized by the digitizer, A is the scale factor of the amplifier which would be 2, and B is the offset which, as noted above, would typically be either −0.8 or 0.8 depending on which amplifier, amplifier 108 or 110, is used:

$$y = \frac{e^{C \cdot (A \cdot x + B)} - 1}{e^{C \cdot (A \cdot x + B)} + 1} \quad (2)$$

Figure 3:
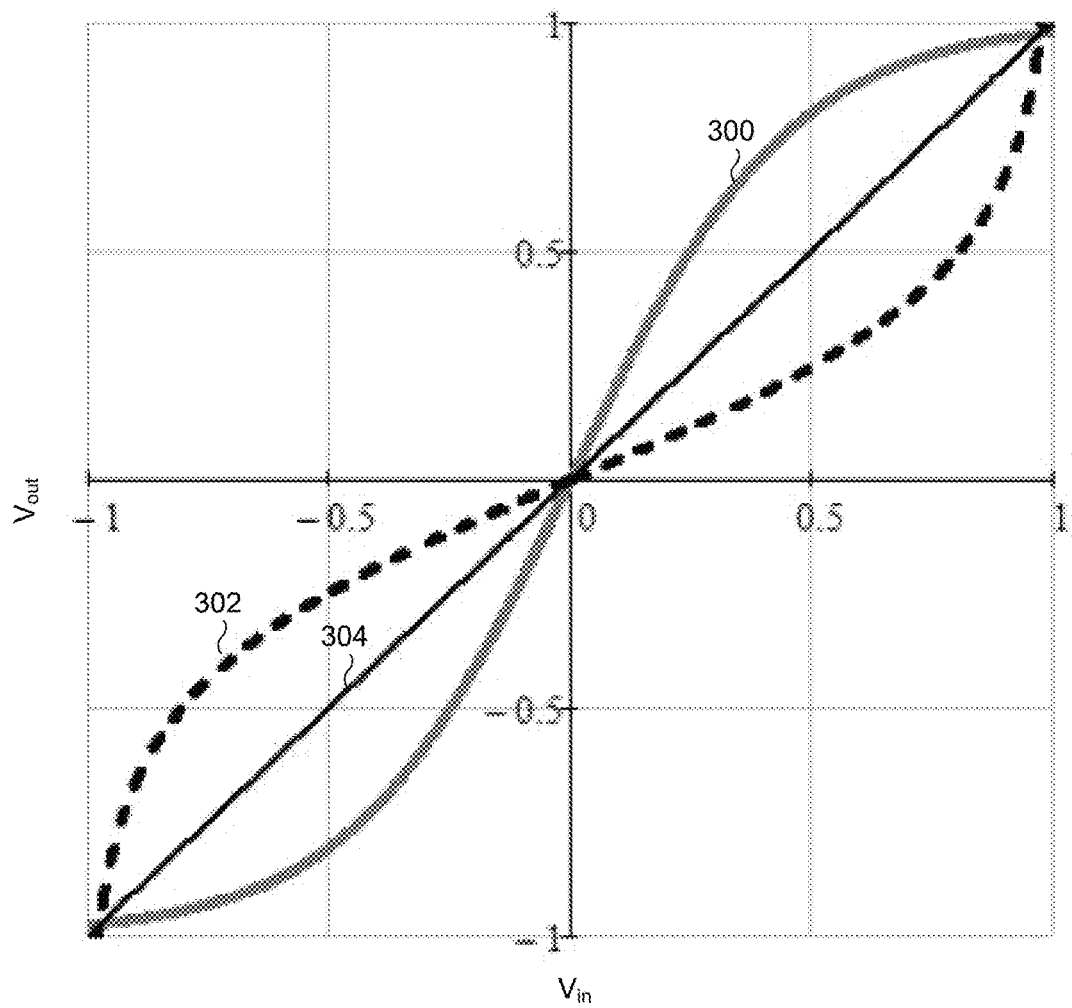
FIG. 3 illustrates a hyperbolic tangent function, its inverse function, and the corrected response to obtain a linear function.

Thus, y will be the desired transfer function of Vout/Vin for the amplifiers 108 and 110. The general shape of the transfer function is shown in FIGS. 2 and 3. For signal reconstruction, the inverse tanh function is used. It may be derived by solving equation (2) above for x in terms of y:

$$x = \frac{1}{A \cdot C} \cdot \ln\left(\frac{1+y}{1-y}\right) - \frac{B}{A} \quad (3)$$

The plot shown in FIG. 3 shows the tanh function in curve 300. The other curve 302 is the $\tanh^{-1}$ function and curve 304 is a plot of the invTanh(Tanh). Thus, the system is restored back to the desired linear transfer function show as curve 304.

FIG. 4 illustrates a more detailed system block diagram of FIG. 1. As seen in FIG. 4, the system may be configured with switches 400, 402, 404, and 406. The switches 400-406 allow operation of either a standard two channel mode of an oscilloscope or as a single channel with two compressed amplifiers stacked. When in a standard two channel mode operation, the switches are switched so the two input signals on each channel are each sent to separate paths and not sent to the splitter 102. Otherwise, only one input signal is received on a single channel input through switch 400 and the switches are switched so that input signal is split via splitter 102. As shown in FIG. 4, the signal is received from switch 400, while switch 404 does not make contact with either line of that channel. The amplifiers 108 and 110 have a scale and offset that is different between the two modes.

In FIG. 4, the offsets are added into the signals in the amplifiers 108 and 110, as discussed above. Attenuators (not shown) are included in front of amplifiers 108 and 110 or as part of their internal design. Both amplifiers 108 and 110 have the tanh transfer function design to prevent clipping saturation of the amplifier transistors. Thus, long recovery time resulting from saturated transistors is avoided.

Limiters 408 and 410 may optionally be provided to ensure that the digitized data never goes outside of the range of the tanh functions. The added digitizer noise or drift with temperature may cause the signal to go outside these limits. Thus, limiters 408 and 410 prevent large spikes in the output during reconstruction. The equations for the clipping function are:

$$ch1 := \text{if } (ch1 \leq -\text{clipLevel}, -\text{clipLevel}, \text{if} \\ (ch1 > \text{clipLevel}, \text{clipLevel}, ch1)) \quad (4)$$

$$ch2 := \text{if } (ch2 > \text{clipLevel}, \text{clipLevel}, \text{if } (ch2 \leq -\text{clipLevel}, -\text{clipLevel}, ch2)) \quad (5)$$

Where clipLevel is the maximum value that the tanh range covers, minus some margin. The if functions in equations (4) and (5) above, and equation (7) below, conform to the following logic:

Z=if(condition, x, y) means Z=x if the condition is true, and Z=y if the condition is false.

For example, with respect to equation (4), the waveform used for channel 1 is the negative clip level if channel 1 is less than or equal to the negative clip level, or the waveform used for channel 1 is the positive clip level if the waveform is greater than the positive clip level; otherwise, the waveform on channel 1 itself is used.

Therefore, a value of 0.99 may be a reasonable value for clipLevel. The $\tanh^{-1}$ function blocks 412 and 414 process the limited input signals according to equation (3) above, where y is the output of the limiters 408 and 410 and x is the output of the $\tanh^{-1}$ block. This restores the half of signal range back to its original shape. Limiters 408 and 410 functions and $\tan^{-1}$ block 412 and 414 functions would be performed on at least one processor.

Then, two summing blocks 416 and 418 remove the offset from the two signals to put them both back to their original vertical position with respect to each other, resulting in signals c1 and c2. This is the same amount of offset that was originally added via the offset value into amplifiers 108 and 110.

The combiner 420 takes c1 and c2 as inputs and outputs yy according to equations (6) and (7):

$$hys := 1 - \text{thresholdOffset} \quad (6)$$

$$yy := \text{if } \left(c1 > hys, c1, \text{if } \left(c2 < -hys, c2, \frac{c1+c2}{2}\right)\right) \cdot \frac{1}{A} \quad (7)$$

The value of yy is the reconstructed version of the original input signal x. The overall process of acquiring and computing the yy waveform has resulted in a system that improves the signal-to-noise ratio between the input signal and the noise created by the digitizers 112 and 114.

The value of the clipLevel above depends on the amount of overlap that was assigned to the two channel stack amplifiers. For example, let the digitizers 112 and 114 range be 1 to −1. Then, a value for overlap may be 0.8 where 0.8 of the range of each digitizer used for the signal and 0.2 of the range is overlapped with the range of the other digitizer. The level should be adjusted so the overlap width is slightly greater than the digitizer noise. This allows for the digitizer noise to be averaged out using data from both channels whenever the signal level is within the overlap range.

The non-linear correction filter 122 may be used to correct the output signal yy and outputs a corrected output signal yyy It is likely that the tanh function in the amplifiers 108 and 110 will have some variation as a function of frequency, temperature, and humidity. If it is a function of frequency, it cannot be corrected by a simple filter because there are normally many simultaneous frequencies in the input signal 100. Thus, a complex non-linear correction filter 122 arrangement is preferable. An example of such a correction filter is described in Polyphase Nonlinear Equalization of Time-Interleaved Analog-to-Digital Converters", by Joel Goodman, Benjamin Miller, Matthew Herman, Gil Raz, and Jefferey Jackson, published in IEEE Journal of Selected Topics in signal Processing Vol 3, NO 3, June 2009, which is incorporated herein in its entirety by reference.

Although the examples above are for systems using a two-way stacking, the configuration and equations may be expanded to apply the same principals to any number of digitizers and stacked amplifiers. The number is only limited by the overall expense and electrical characteristics of the components. For example, as the number of channels increases, the amount of scale needed for the amplifiers increases. This then increases analog noise prior to the signal being digitized by the digitizer. This then results in needing to increase the range of the offsets. In addition, it likely makes it more difficult to fit the tanh functions in the digitizer range and keep them constant with temperature, frequency, etc.

Figure 5:
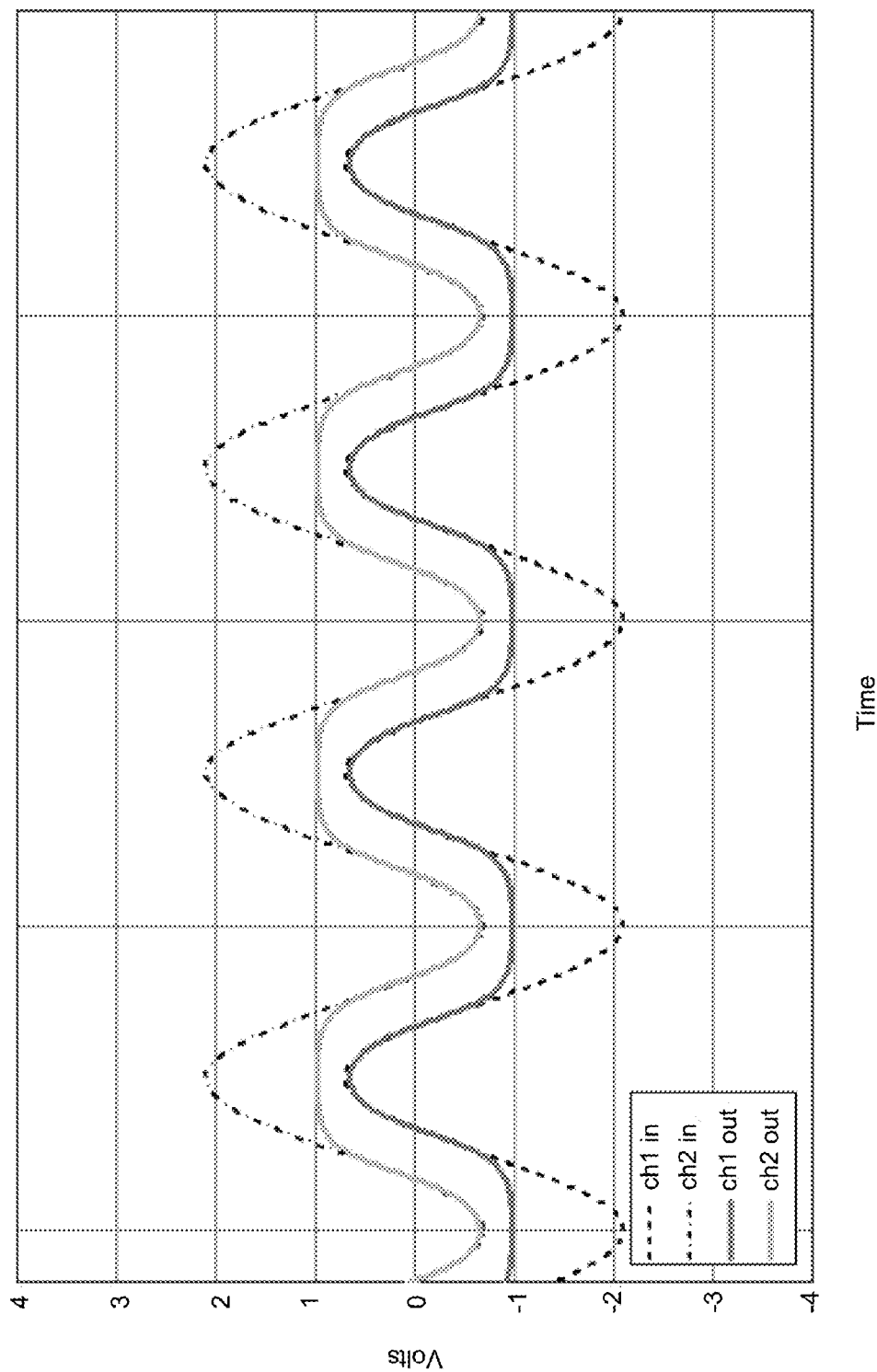
FIG. 5 illustrates the input waveforms with scale offset and output waveforms with compression and no noise.

FIG. 5 shows a plot of the input signal 100 split into two channels and scaled by a gain factor of 2× and offset by 0.8 on the path related to channel 2 and by offset −0.8 on the path related to channel 1. The sine wave shape is shown after applying the tanh function to each of these scaled and offset waveforms. At this point, the analog circuitry is assumed to have zero noise compared to the digitizer noise.

Figure 6:
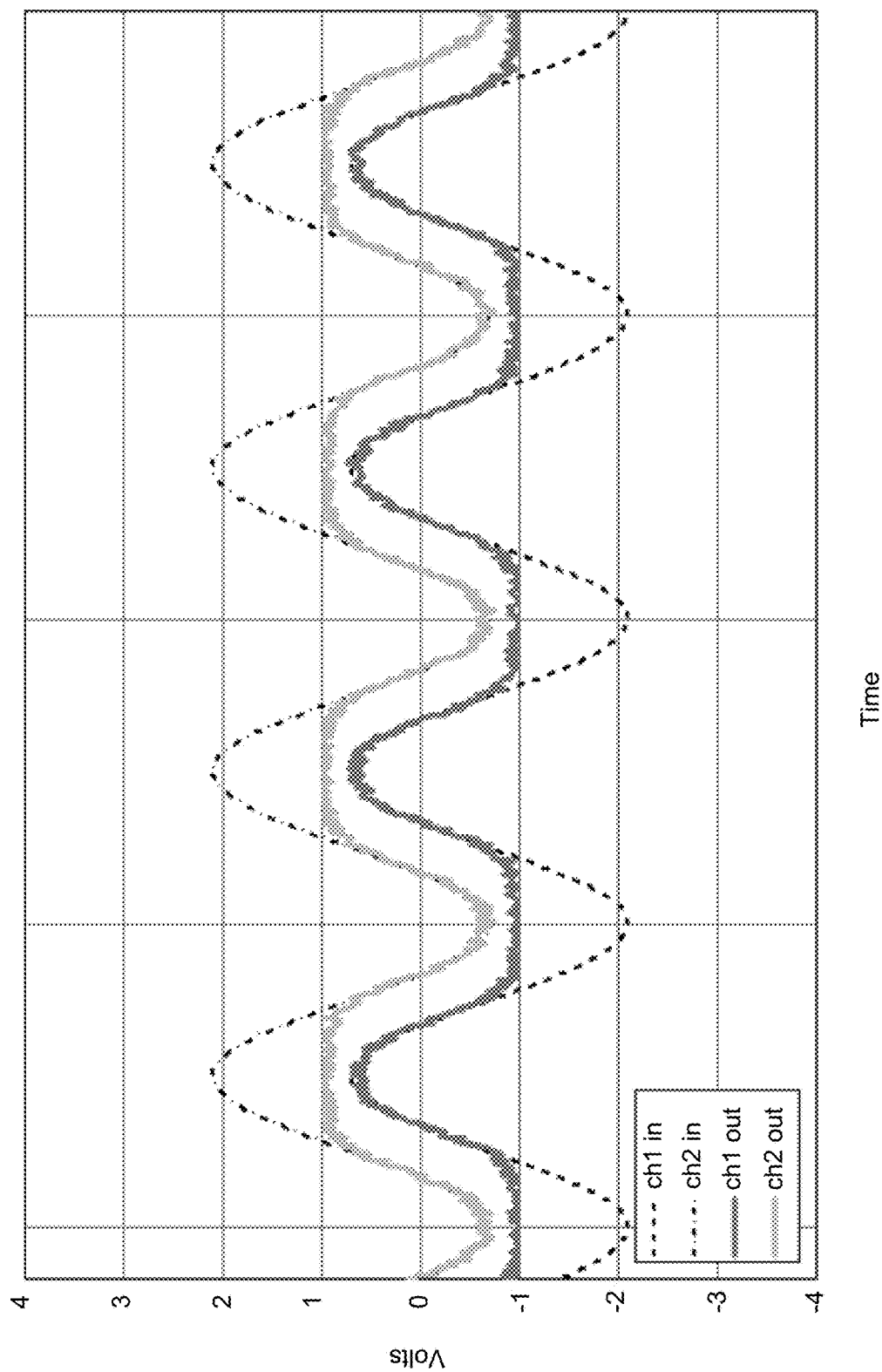
FIG. 6 illustrates the effect of digitizer noise on the compressed waveform.

The digitizer noise effects are shown on the two compressed waveforms in FIG. 6. This noise is inserted at the front end of each of the digitizers in the resistive divider and comparators inputs. The overlap range is 0.7 in this figure.

Figure 7:
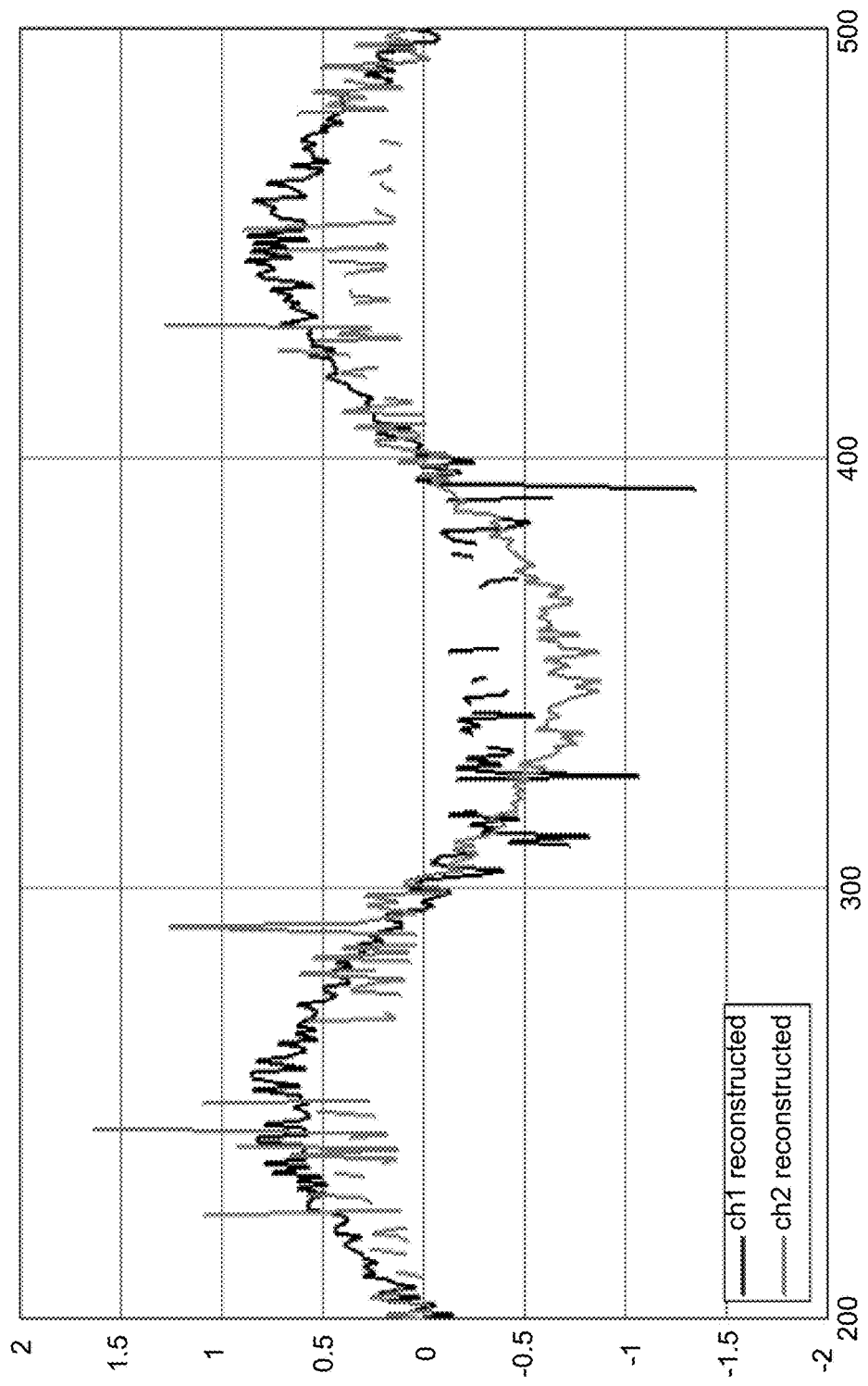
FIG. 7 illustrates the effects of data samples outside the range of the hyperbolic tangent function when input to the inverse hyperbolic tangent function.
Figure 8:
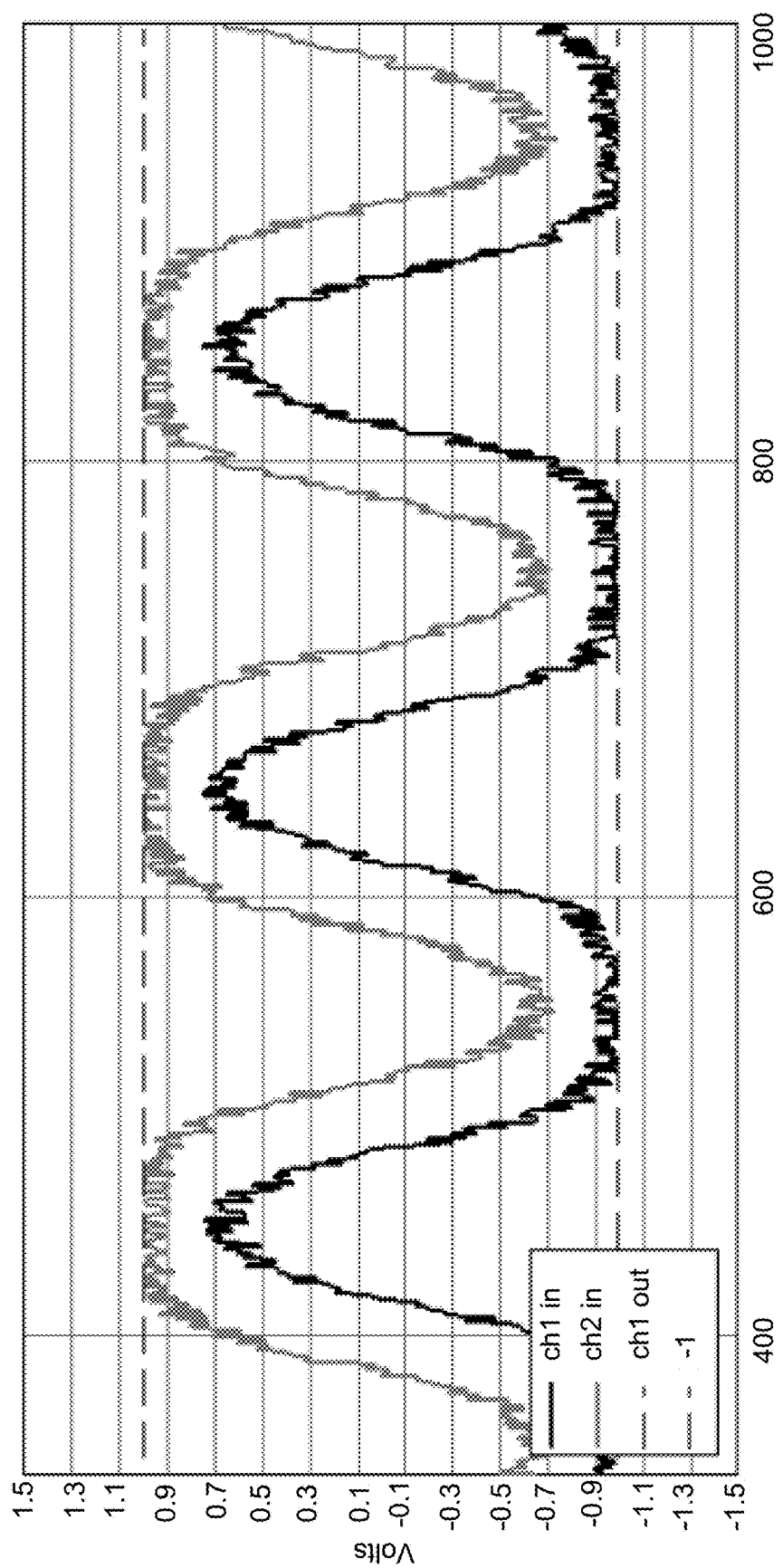
FIG. 8 illustrates clipping the noisy part of the signal to stay within the range of the hyperbolic tangent.

If any of the data out of the digitizers falls outside of the tanh range then NaN, not a number, occurs and the reconstructed results would be erratic, as shown in FIG. 7. Thus, a limiting function via limiters 408 and 410 is preferably added to the reconstruction process to ensure this does not occur in the event any hardware drifts occur. The limiting function is shown in FIG. 8.

Figure 9:
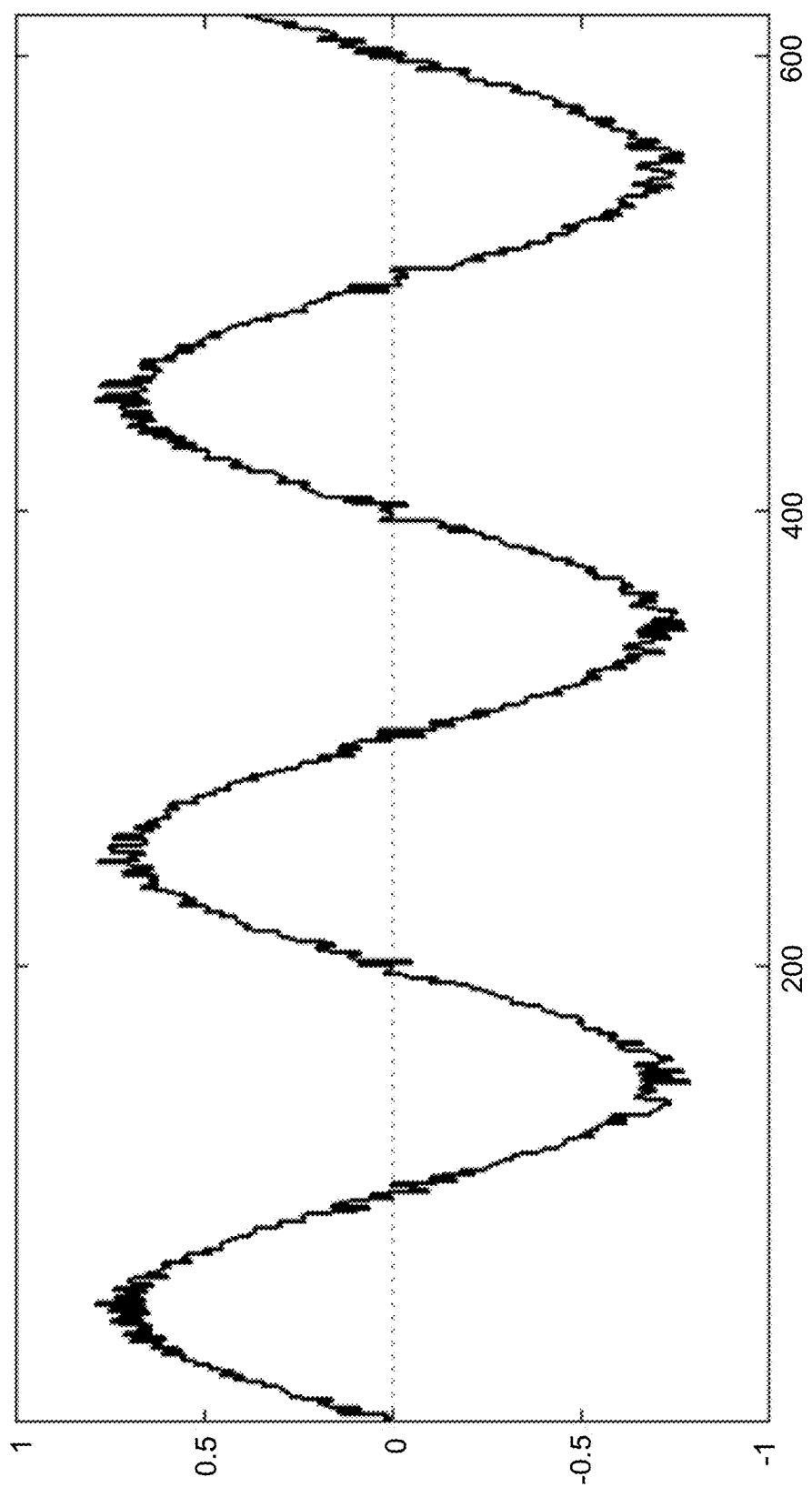
FIG. 9 illustrates the effects of reconstruction without an overlap region.

If overlap of the two channel regions was zero, then no averaging of the two signals in the overlapped region would be performed during reconstruction. The resulting effects on noise distribution after the $tanh^{-1}$ function and reconstruction are shown in FIG. 9. The reconstruction logic rejects the compressed area of each half cycle and keeps data from one of the two channels at each time position. That is, the reconstruction logic keeps the non-compressed portion of each path while rejecting the compressed portion.

In this particular case, the zero crossing area has high compression and thus when it is expanded, the noise is larger in this area than it is in other areas of the waveform. This is also true of the full scale peaks. The reconstructed waveform shows higher noise at the crossing and the peaks, but lower noise in between the areas. These effects may be minimized by allowing for overlap which reduces the amount of compression in the overlap area, and also incorporates averaging of the two channels in the overlap region.

Figure 10:
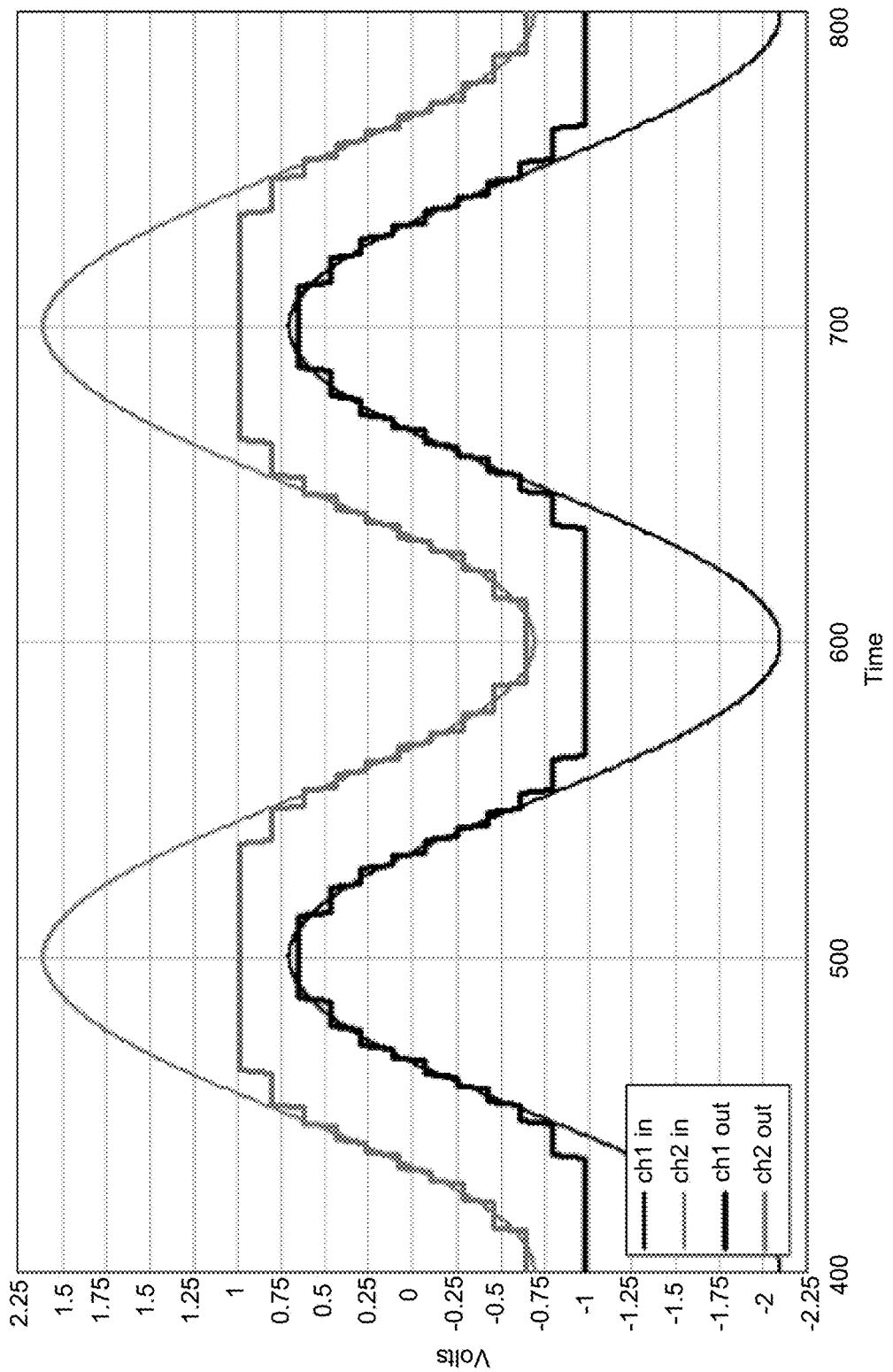
FIG. 10 illustrates the effects of the hyperbolic tangent function on ten digitizing levels of a simulated digitizer.
Figure 11:
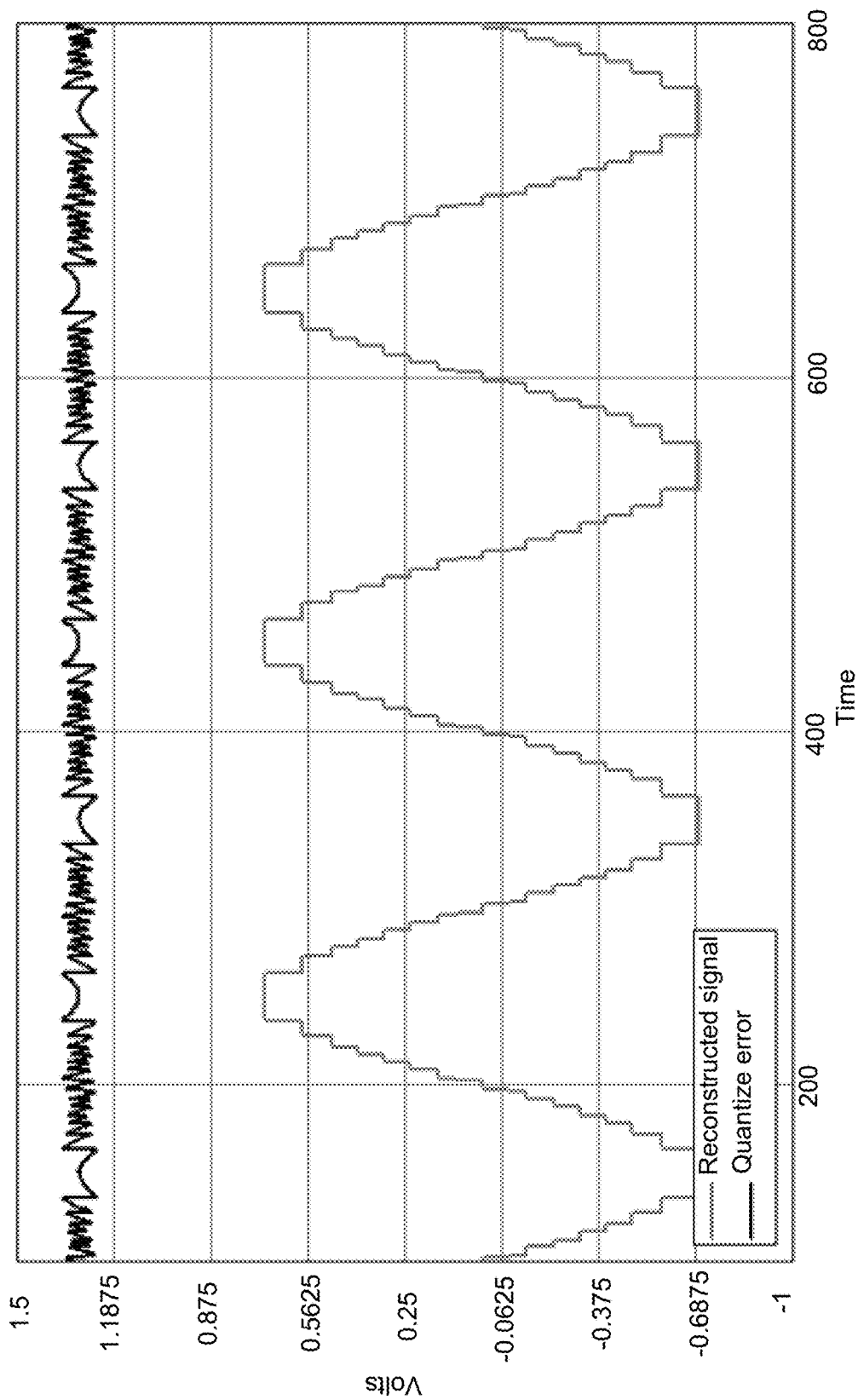
FIG. 11 illustrates the effects of the hyperbolic tangent function on twenty digitizing levels of a simulated digitizer.

FIGS. 10 and 11 show the effects of the overall system on the digitizing levels in the final reconstructed signal. For this example, ten digitizing levels were placed on each of the two channel waveforms after they had pass through the simulated amplifier block. In practice, there would typically be 256 digitizing levels from an 8-bit digitizer. In FIG. 11, the reconstructed signal has twenty levels, which is twice as many as shown in FIG. 10. However, the digitizing levels at the peaks and at the middle overlap region are larger than the digitizing levels in between, due to the effects discussed above.

Figure 12:
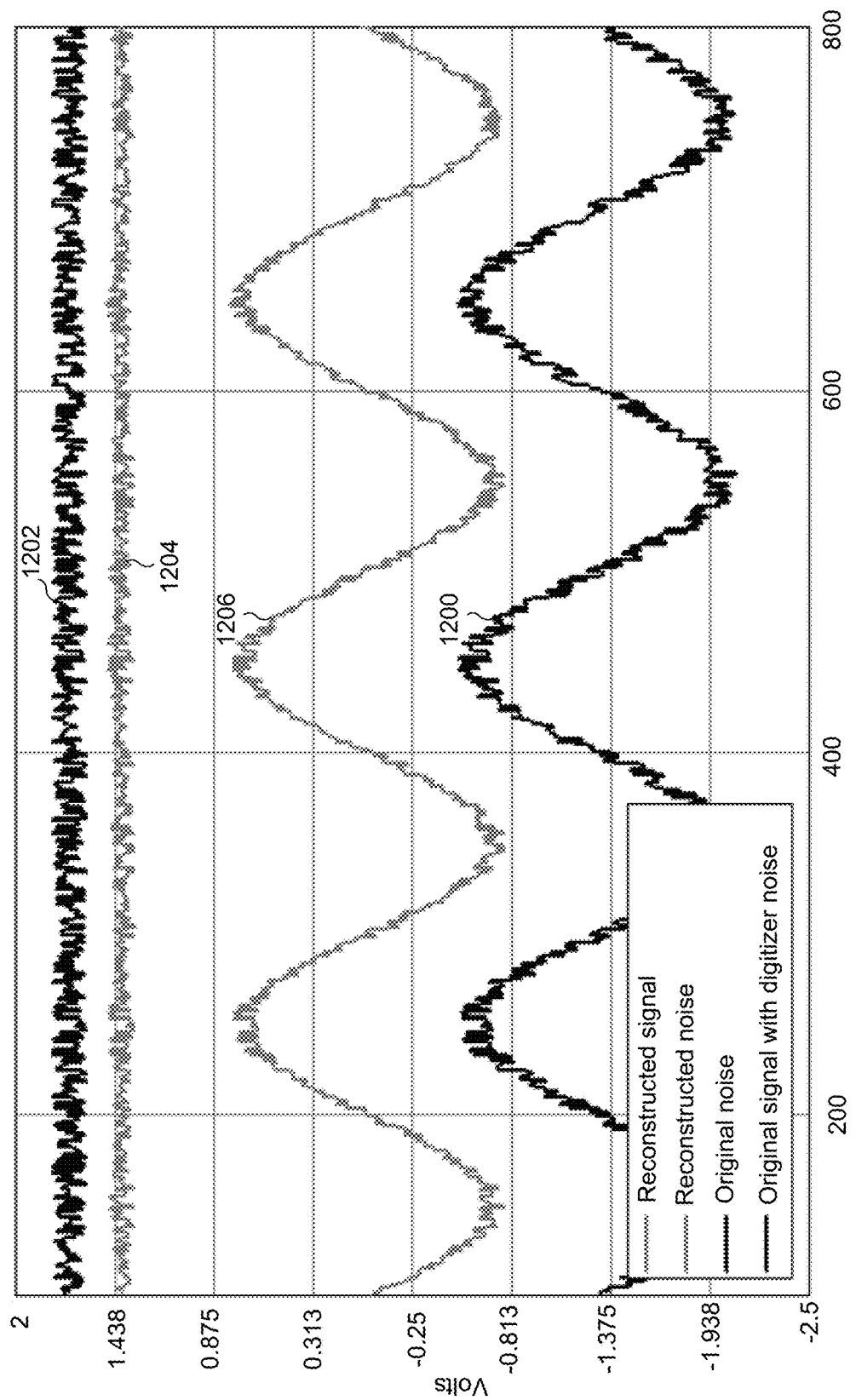
FIG. 12 illustrates the original signal and reconstructed signal, and the noise associated with each.

FIG. 12 depicts the input signal (original signal) 1200 and the input signal with digitizer noise 1202. FIG. 12 also depicts the reduced noise in the reconstructed signal 1204 along with the reconstructed signal 1206, when the input signal was acquired by two digitizers and reconstructed according to the disclosed technology.

The tanh function introduces a non-linearity into the signal which generates higher frequency harmonics. As discussed above, the purpose of the tanh function is to compress one half cycle of the signal to prevent amplifier and digitizer saturation after adding an offset. Thus, if a sine wave has a frequency that is close to the Nyquist frequency of the digitizer then the tanh function will generate harmonics that will alias. For the 100 GS/s digitizer channels in current oscilloscopes the hardware will perform anti-alias filtering with a bandwidth of 37 Ghz and a Nyquist at 50 GHz. The clipped area and the bending into the clipped area will not be included in the reconstruction, so the requirements for how much over-sampling is needed is not as high as one would assume is necessary. The DC term is due to the offset that was also added to the signal.

Thus, for a sine wave signal, the maximum frequency that can be allowed without reconstruction distortion is limited to a value that will allow enough tanh harmonics to pass so the inverse tanh reconstruction function can recover the original signal values. Examples are shown in FIGS. 13-16. This is a much less common problem for a random pulse signal because room must be allowed for the signal and harmonics of up to $3^{rd}$ or $5^{th}$ typically. Since this is in the same range as what is needed by the tanh function for reconstructions, the bandwidth requirement for tanh are not an issue. It becomes an issue mainly for sine waves.

Figure 13:
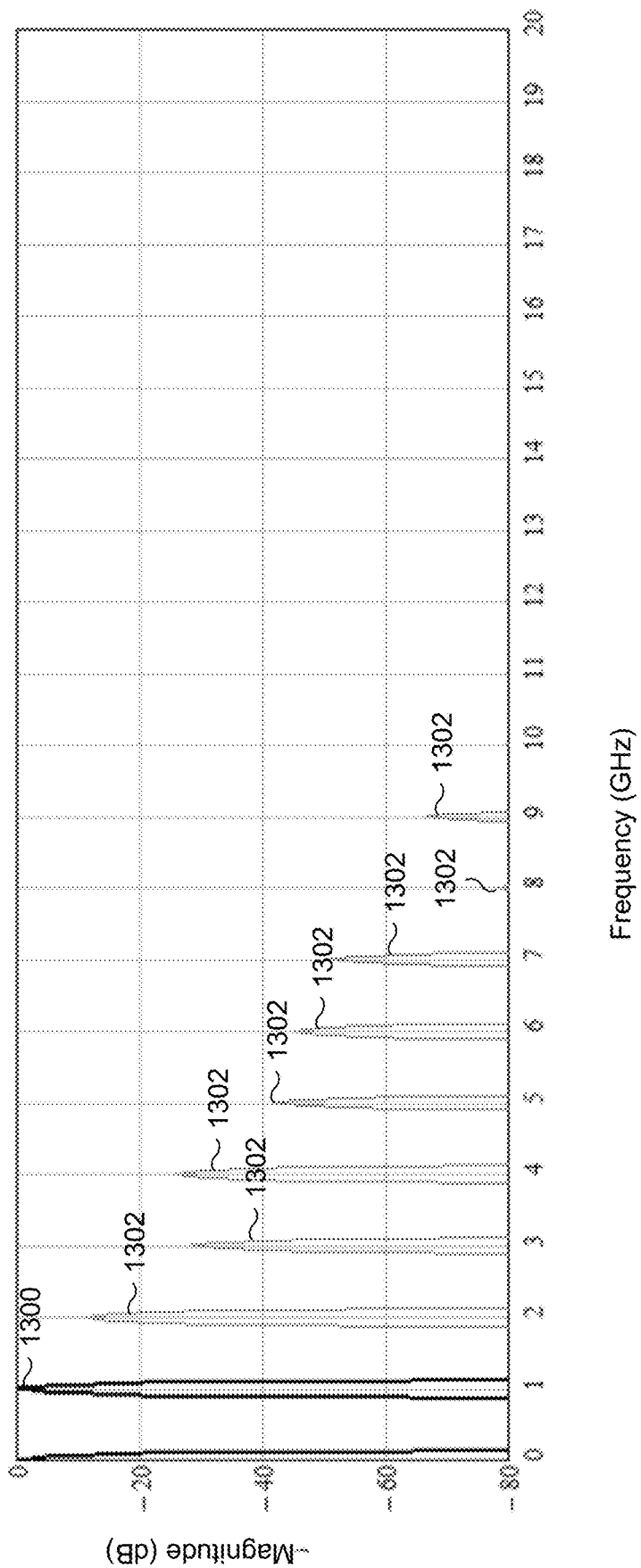
FIG. 13 illustrates the harmonics of a sine wave with an offset function fed through a hyperbolic tangent function.

FIG. 13 shows the harmonic content of a sine wave that has been compressed by the tanh function prior to being digitized. The fundamental is shown at 1300 and the harmonics are shown at 1302. The harmonics are necessary for ½ cycles of the sine wave to be compressed for approximately a ½ sine cycle of the remaining part to fit within the range of the digitizers. The question arises as to how much error occurs if the harmonics are limited prior to digitizing. This limits the overall bandwidth that would be usable for noise reduction purposes using this disclosed technology for a sine wave.

Worst case bandwidth requirement would be to keep harmonic 1 thru 4 for a bandwidth requirement of a factor of 0.2 Nyquist. Meaning, a sine wave with frequency at 0.2 Nyquist would allow for 4 harmonics created by the tanh compression to pass through the digitizer without aliasing. A bandwidth of 0.5 Nyquist could be used if distortion of the highest harmonics is acceptable for a given application.

Figure 14:
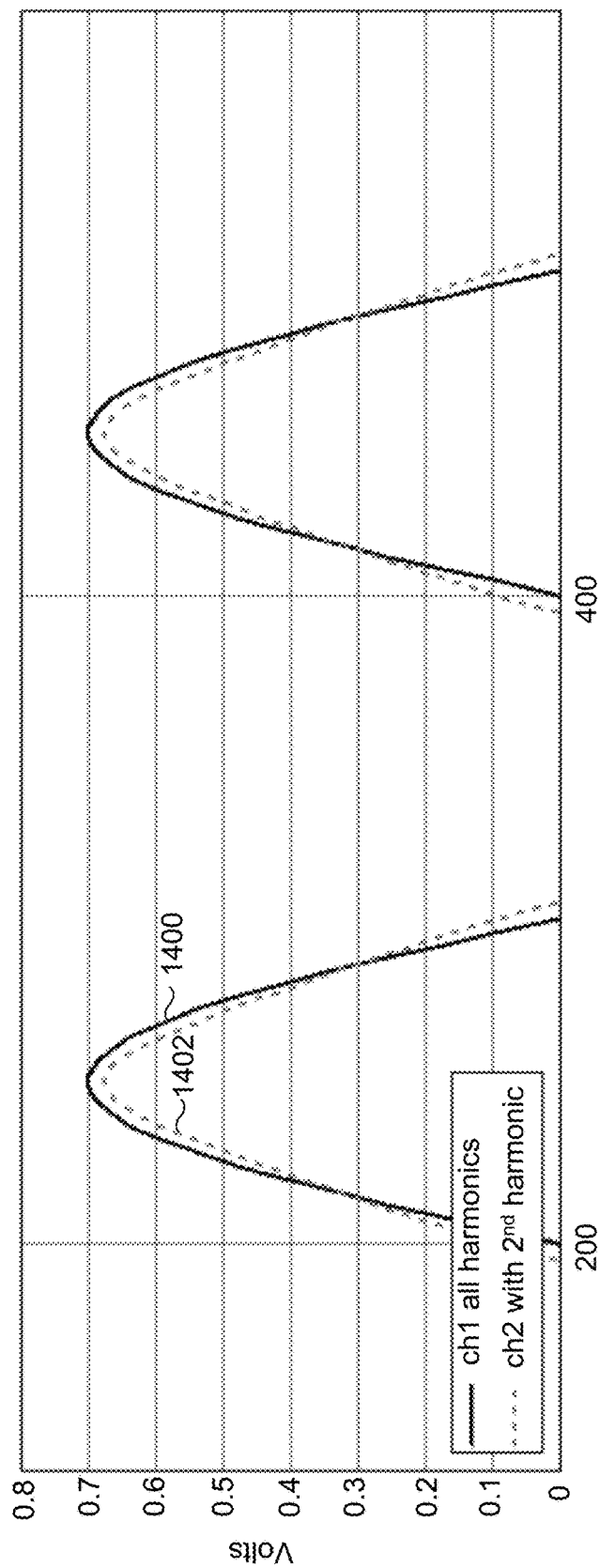
FIG. 14 illustrates a reconstructed signal keeping only the $1^{st}$ and $2^{nd}$ harmonics prior to reconstruction.
Figure 15:
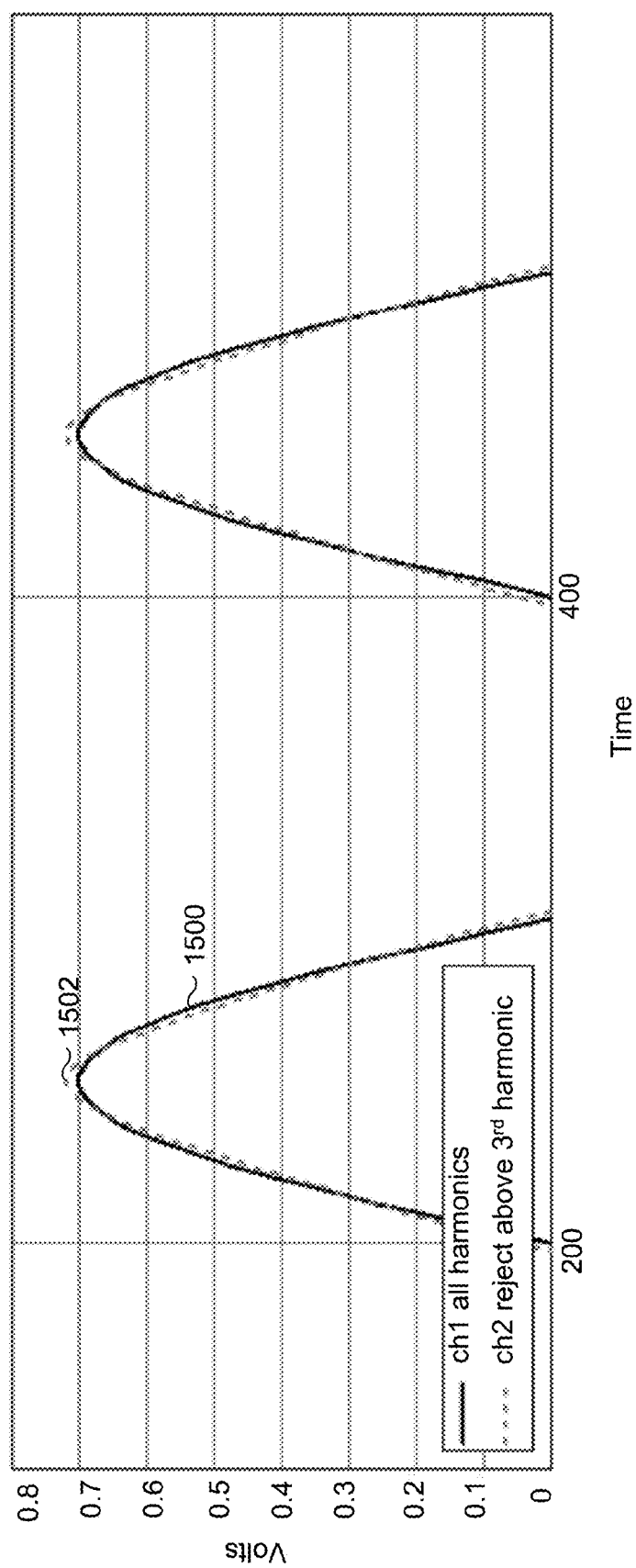
FIG. 15 illustrates a reconstructed signal keeping only the $1^{st}$, $2^{nd}$ and $3^{rd}$ harmonics prior to reconstruction.
Figure 16:
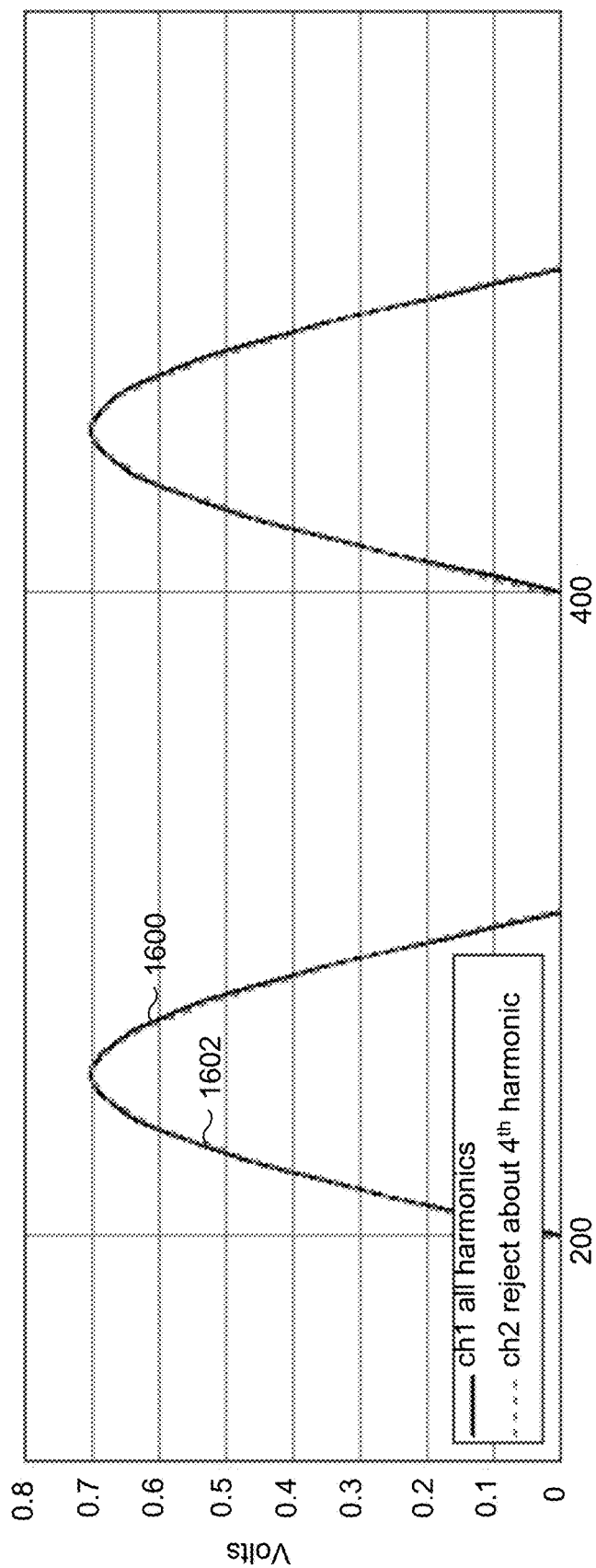
FIG. 16 illustrates a reconstructed signal keeping only the $1^{st}$, $2^{nd}$, $3^{rd}$, and $4^{th}$ harmonics prior to reconstruction.

FIG. 14 illustrates a reconstructed signal keeping only the $1^{st}$ and $2^{nd}$ harmonics prior to reconstructions. Curve 1400 is the sine wave input ½ cycle, while curve 1402 is the recovered signal when only the fundamental ($1^{st}$ harmonic) and $2^{nd}$ harmonic are kept. FIG. 15 illustrates the ideal waveform 1500 and the reconstructed curve 1502 when the $1^{st}$, $2^{nd}$, and $3^{rd}$ harmonics are kept. FIG. 16 illustrates the ideal waveform 1600 and the reconstructed curve 1602 when the $1^{st}$, $2^{nd}$, $3^{rd}$, and $4^{th}$ harmonics are kept.

As can be seen in FIG. 16, the reconstructed signal looks closest to the original input signal with all the harmonics. Therefore, preferably at least the through $4^{th}$ harmonics are kept during reconstruction.

In some embodiments, two paths are implemented. However, any number of paths may be used. If more than two paths are implemented, the splitter 102 will split the input signal 100 into the required number of paths. Then, as mentioned above, formulas may be derived for the necessary band separation filters, using the above equations.

Moreover, although the filtering, summing, and combining have been described as discrete operations, such operations can be combined, incorporated into other functions, or the like. In addition, as the above discussion assumed ideal components, additional compensation can be introduced into such processing as appropriate to correct for non-ideal components. The digitized signals can be upsampled, interpolated, or the like as appropriate.

Another embodiment includes computer readable code embodied on a computer readable medium that, when executed, causes the computer to perform any of the above-described operations. As used here, a computer is any device that can execute code. Microprocessors, programmable logic devices, multiprocessor systems, digital signal processors, personal computers, or the like are all examples of such a computer. In some embodiments, the computer readable medium can be a tangible computer readable medium that is configured to store the computer readable code in a non-transitory manner.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A test and measurement instrument, comprising:
    a splitter configured to split an input signal into two split input signals and output each split input signal onto a separate path, each path including:
        an amplifier configured to receive the split input signal and to compress the split input signal with a sigmoid function;
        a digitizer configured to digitize an output of the amplifier; and
        at least one processor configured to apply an inverse sigmoid function on the output of the digitizer to decompress the split signal; and
    a combiner configured to receive and combine an output of each path to reconstruct the input signal, wherein the reconstructed input signal exhibits less noise than if each of the split input signals were processed without the sigmoid function and inverse sigmoid function.

2. The test and measurement instrument of claim 1, wherein each path further includes:
    a first summer configured to add an offset to the input signal prior to the amplifier; and
    a second summer configured to remove the offset added by the first summer after the processor applies the inverse sigmoid function.

3. The test and measurement instrument of claim 2, wherein the amplifiers have an overlap region based on the offset added in each path.

4. The test and measurement instrument of claim 3, wherein the combiner averages the signals in each path in the overlap region, and selects a signal from either path in the non-overlap regions to reconstruct the input signal.

5. The test and measurement instrument of claim 1, further comprising a non-linear correction filter configured to receive the reconstructed input signal from the combiner and output a filtered reconstructed input signal.

6. The test and measurement instrument of claim 1, wherein each path further includes a limiter configured to receive the output from the digitizer and clip the output when the output is above or below a threshold prior to the processor applying the inverse sigmoid function.

7. The test and measurement instrument of claim 1, further comprising at least two switches, wherein the switches route the input signal to either the splitter or to bypass the splitter.

8. The test and measurement instrument of claim 1, wherein the splitter splits the input signal into three split input signals.

9. The test and measurement instrument of claim 1, wherein the splitter splits the input signal into four split input signals.

10. A method for reconstructing an input signal in a test and measurement instrument, the method comprising:
    splitting an input signal into two split input signals and outputting each split input signal onto a separate path;
    compressing each split input signal with a sigmoid function on each path to produce a modified split input signal;
    digitizing the modified split input signal on each path;
    applying an inverse sigmoid function to the modified split input signal on each path to produce an output signal; and
    reconstructing the input signal by combining the output signal in each path, wherein the reconstructed input signal exhibits less noise than if each of the split input signals were processed without the sigmoid function and inverse sigmoid function.

11. The method of claim 10, further comprising
    adding an offset to the input signal prior to applying the sigmoid function; and
    removing the offset after applying the inverse sigmoid function.

12. The method of claim 11, wherein reconstructing the input signal includes averaging the output signals in each path in an overlap region, and selecting a signal from either path in the non-overlap regions to reconstruct the input signal.

13. The method of claim 10, further comprising filtering the reconstructed input signal through a non-linear correction filter and outputting a filtered reconstructed input signal.

14. The method of claim 10, further comprising clipping the digitized modified input signal on each path when the digitized signal is above or below a threshold.

* * * * *